United States Patent
Kawamoto et al.

(10) Patent No.: US 8,729,929 B2
(45) Date of Patent: May 20, 2014

(54) GATE DRIVING CIRCUIT

(71) Applicant: Denso Corporation, Kariya (JP)

(72) Inventors: Teppei Kawamoto, Anjo (JP); Ryotaro Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/766,865

(22) Filed: Feb. 14, 2013

(65) Prior Publication Data

US 2013/0214823 A1  Aug. 22, 2013

(30) Foreign Application Priority Data

Feb. 16, 2012  (JP) .................................. 2012-031593

(51) Int. Cl.
*H03B 1/00* (2006.01)
*H03K 3/00* (2006.01)

(52) U.S. Cl.
USPC ........... 327/108; 327/109; 327/110; 327/111; 327/112

(58) Field of Classification Search
USPC .......................... 327/108, 109, 110, 111, 112
See application file for complete search history.

(56) References Cited

U.S. PATENT DOCUMENTS

| | | | |
|---|---|---|---|
| 7,710,187 B2 * | 5/2010 | Hiyama | ........................ 327/374 |
| 2008/0004773 A1 | 1/2008 | Maeda | |
| 2009/0002054 A1 | 1/2009 | Tsunoda et al. | |
| 2009/0066402 A1 | 3/2009 | Hiyama | |
| 2010/0176783 A1 | 7/2010 | Tagome | |
| 2012/0126859 A1 | 5/2012 | Kawamoto et al. | |

FOREIGN PATENT DOCUMENTS

JP          2006-74937 A      3/2006

* cited by examiner

*Primary Examiner* — John Poos
(74) *Attorney, Agent, or Firm* — Posz Law Group, PLC

(57) ABSTRACT

A gate driving circuit includes a gate control circuit and a gate voltage limit circuit. The gate control circuit establishes or breaks electrical continuity of a gate voltage supply path from a power source line to a gate terminal of a transistor in response to an on-command and an off-command. The gate voltage limit circuit limits a gate voltage of the transistor to be less than or equal to a first voltage in response to the on-command at least in a period until a determination of whether an electric current greater than a fault criterion value flows to the transistor ends and then limits the gate voltage to be less than or equal to a second voltage.

7 Claims, 9 Drawing Sheets

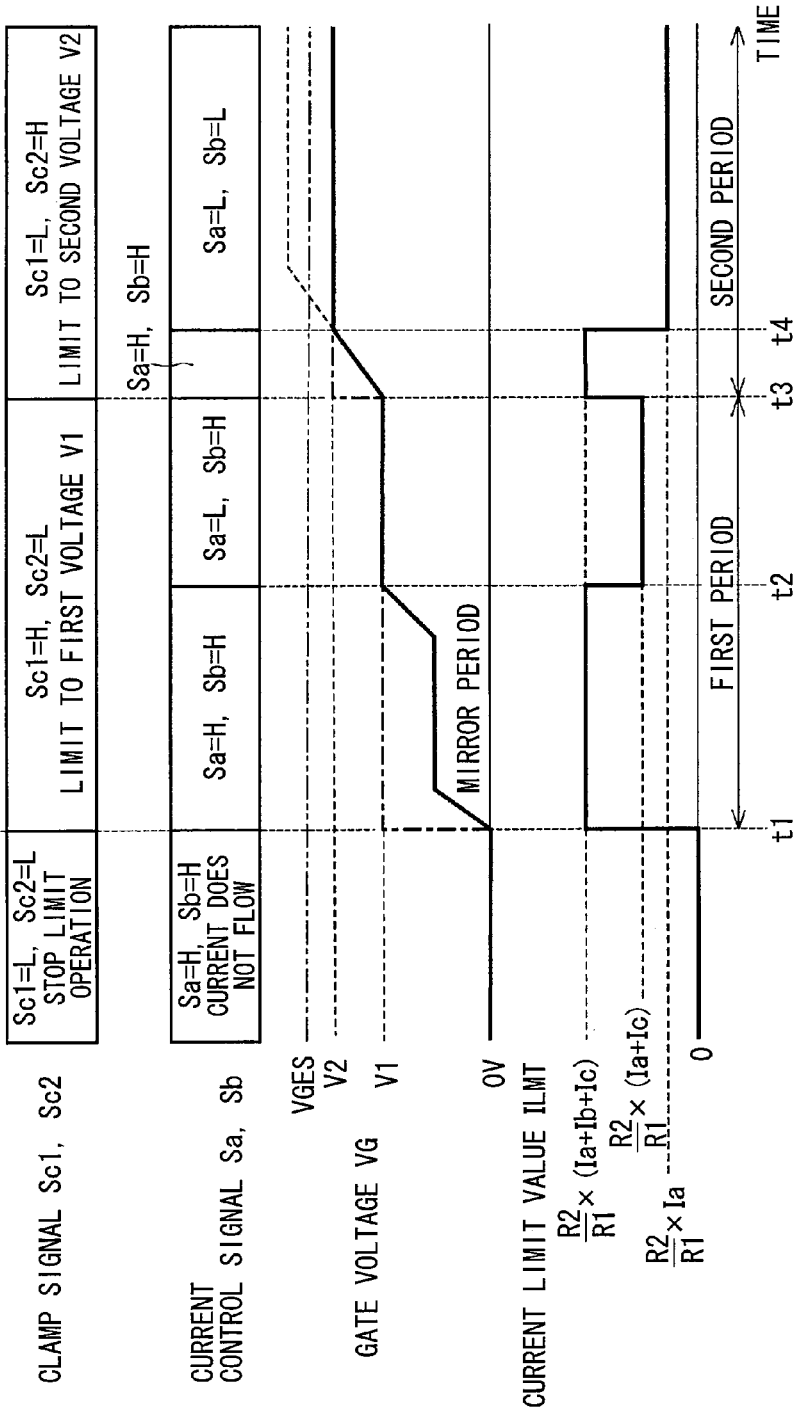

US 8,729,929 B2

GATE DRIVING CIRCUIT

CROSS REFERENCE TO RELATED APPLICATIONS

The present application is based on and claims priority to Japanese Patent Application No. 2012-31593 filed on Feb. 16, 2012, the contents of which are incorporated in their entirety herein by reference.

TECHNICAL FIELD

The present disclosure relates to a gate driving circuit.

BACKGROUND

In case where a short circuit fault occurs in one of an upper arm transistor and a lower arm transistor that form a bridge circuit, and the other transistor without the short circuit fault is turned on, a short-circuit current may flow into the transistors and a secondary fault may occur. Also when an output terminal for coupling a load makes a short-circuit to a power source line or when a short circuit fault occurs in windings of a motor as a load, a similar issue may occur.

JP-A-2009-71956 (corresponding to US 2009/0066402 A1) discloses a technique in which, in cases where a transistor is an insulated gate bipolar transistor (IGBT), when an on-command is given, a gate voltage slightly greater than a threshold value is applied to the IGBT to activate the IGBT in an active region, and the presence or absence of a short circuit fault is detected based on a detection current at the time. Then, after it is determined that a short circuit fault does not occur, a sufficiently high gate voltage is applied to activate the IGBT in a saturation region.

In the above-described configuration, when the gate voltage is too high to exceed a gate breakdown voltage VGES of the IGBT, the IGBT may be damaged or a life of the IGBT may be reduced. In a conventional gate driving circuit, a transitional increase of the gate voltage due to a surge is protected with a zener diode and the like, and a stationary increase of the gate voltage due to a change in a power source voltage is protected with a stabilizing power source. Both of a circuit that performs the short circuit protection and a circuit that performs the gate protection limits the gate voltage. However, because characteristics of the protections are completely different, an integrated circuit has not existed so far. The inventors of the present application found disadvantages of the conventional gate driving circuit, such as, an increase in a circuit size and a deterioration of a relative precision of protection levels of the short circuit protection and the gate protection.

SUMMARY

It is an object of the present disclosure to provide a gate driving circuit that can perform a short circuit protection and a gate protection using a single gate voltage limit circuit.

A gate driving circuit according to an aspect of the present disclosure includes a gate control circuit and a gate voltage limit circuit. The gate control circuit establishes electrical continuity of a gate voltage supply path from a power source line to a gate terminal of a transistor in response to an on-command and breaks electrical continuity of the gate supply path in response to an off-command.

The gate voltage limit circuit limits a gate voltage of the transistor to be less than or equal to a first voltage in response to the on-command at least in a period until a determination of whether an electric current greater than a fault criterion value flows to the transistor ends and then limiting the gate voltage of the transistor to be less than or equal to a second voltage. The first voltage is set so that the electric current flowing to the transistor is less than or equal to a maximum allowable current regardless of a voltage applied to the transistor. The second voltage is set to be less than or equal to a gate breakdown voltage of the transistor The gate driving circuit can perform a short circuit protection and a gate protection using the single gate voltage limit circuit.

BRIEF DESCRIPTION OF THE DRAWINGS

Additional objects and advantages of the present disclosure will be more readily apparent from the following detailed description when taken together with the accompanying drawings. In the drawings:

FIG. 9 is a diagram showing a correspondence relationship between a state of each signal and waveforms of a gate voltage and a current limit value according to the sixth embodiment.

DETAILED DESCRIPTION (First Embodiment)

Figure 2:
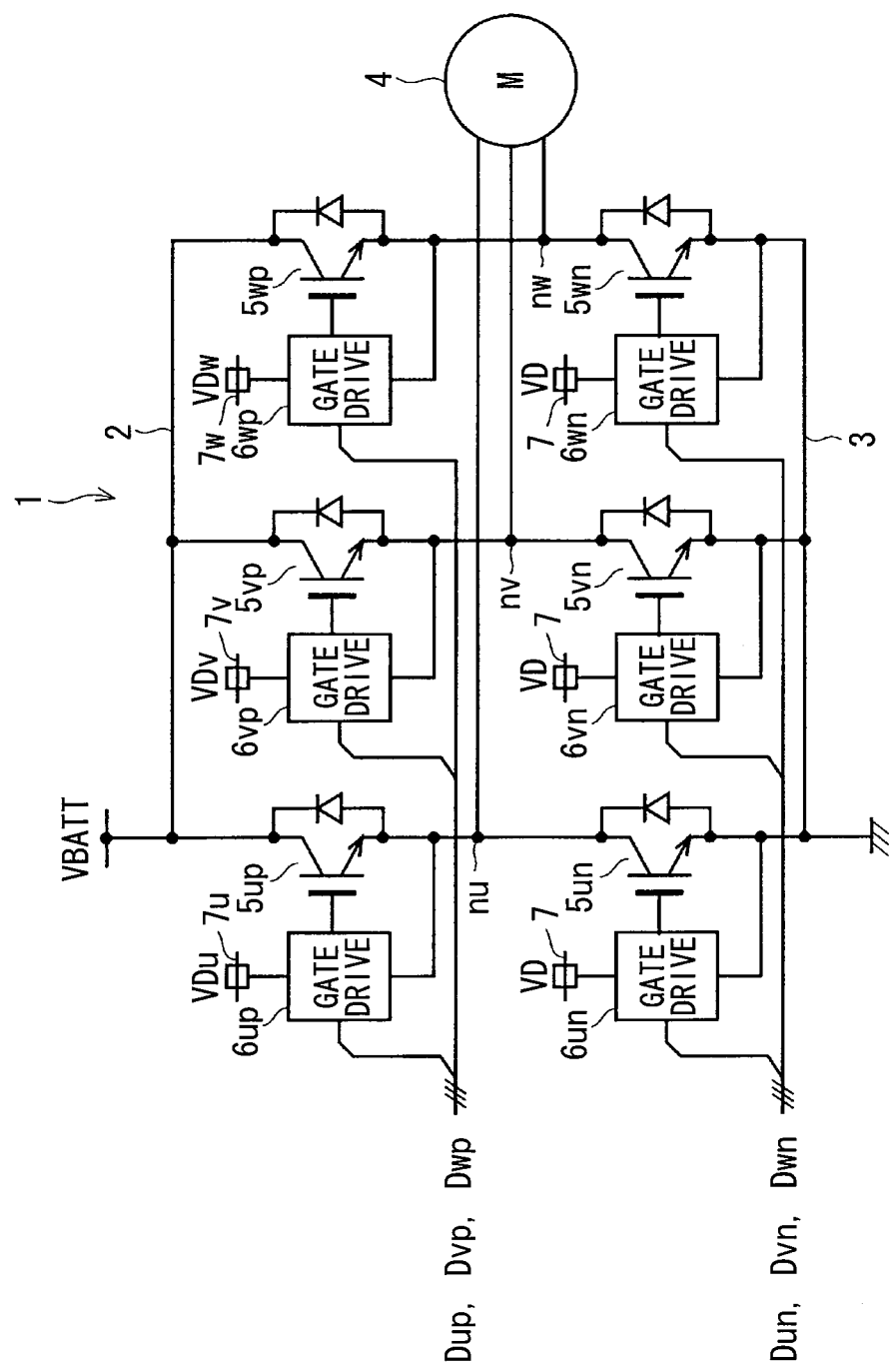
FIG. 2 is a diagram showing an inverter device.
Figure 3:
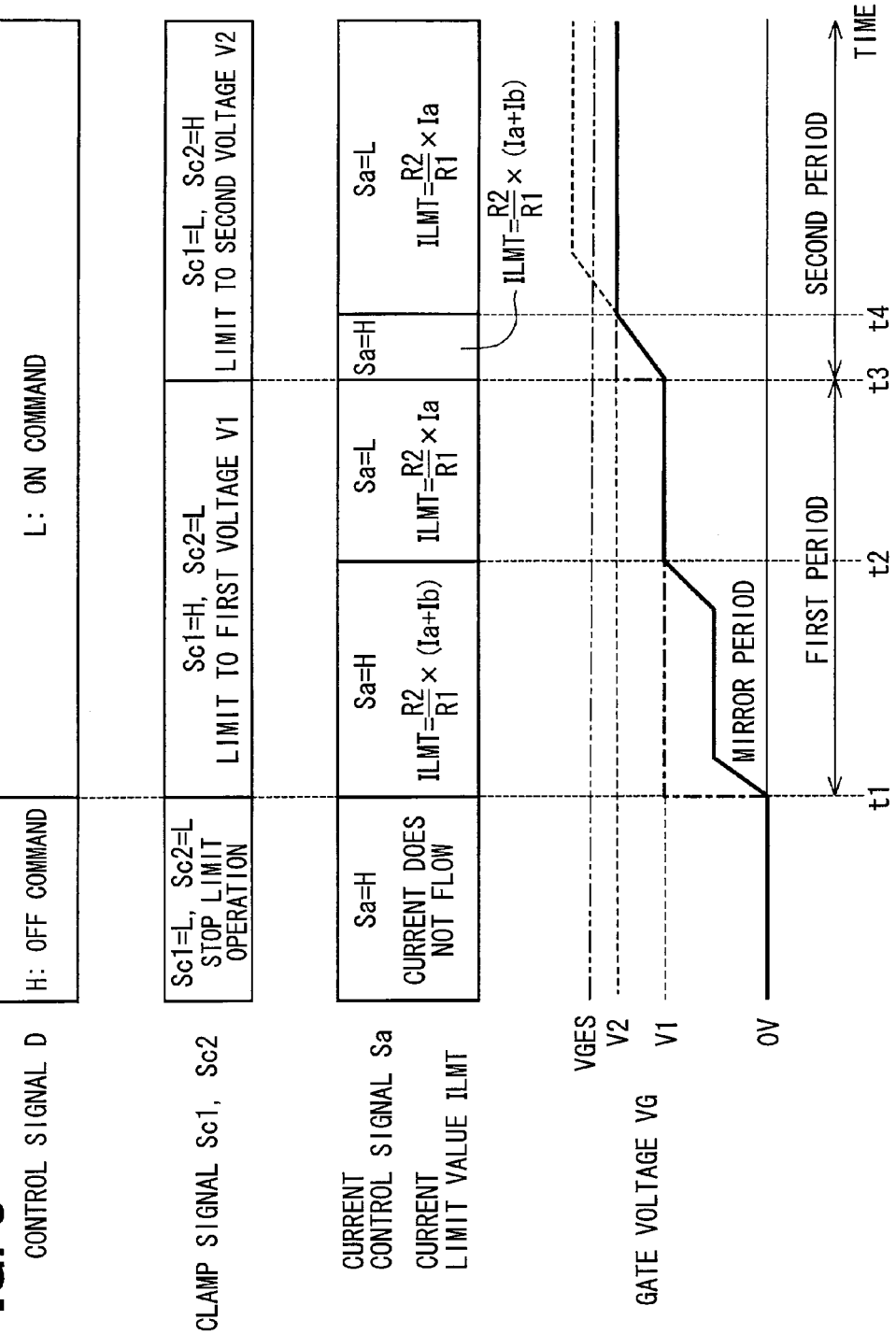
FIG. 3 is a diagram showing a correspondence relationship between a state of each signal and a waveform of a gate voltage.

A first embodiment of the present disclosure will be described with reference to FIG. 1 to FIG. 3. An inverter device 1 shown in FIG. 2 is supplied with a battery voltage VBATT from an in-vehicle battery through power source lines 2, 3 and transmits an alternating voltage to a brushless DC motor 4 based on pulse-width modulation (PWM) control signals Dup, Dvp, Dwp, Dun, Dvn, Dwn transmitted from a microcomputer (not shown) through a photo coupler.

Between the power source lines 2, 3, IGBTs 5*up*, 5*vp*, 5*wp* for upper arms and IGBTs 5*un*, 5*vn*, 5*wn* for lower arms form a three-phase bridge circuit. Each of the IGBTs is coupled in parallel with a free wheel diode. Each of the IGBTs 5*up*-5*wn* is an individual module including an IGBT for sensing current. The IGBTs 5*up*-5*wn* are respectively driven by gate driving circuits 6*up*-6*wn*. Each of the gate driving circuits 6*up*-6*wn* is an individual integrated circuits (IC).

The gate driving circuits 6*up*, 6*vp*, 6*wp* for the upper arms are respectively supplied with power source voltages VDu, Vdv, VDw through power source lines 7*u*, 7*v*, 7*w*. Reference potentials of the power source lines 7*u*, 7*v*, 7*w* are output nodes nu, nv, nw, respectively. The gate driving circuits 6*un*, 6*vn*, 6*wn* for the lower arms are supplied with a power source voltage VD through a power source line 7. A reference potential of the power source line 7 is the ground. Because the gate driving circuits 6*up*-6*wn* have the same configuration, the gate driving circuits 6up-6wn is generalized as a gate driving circuit 6. Similarly, the IGBTs 5up-5wn are generalized as an IGBT 5, and the control signals Dup-Dwn are generalized as a control signal D.

Figure 1:
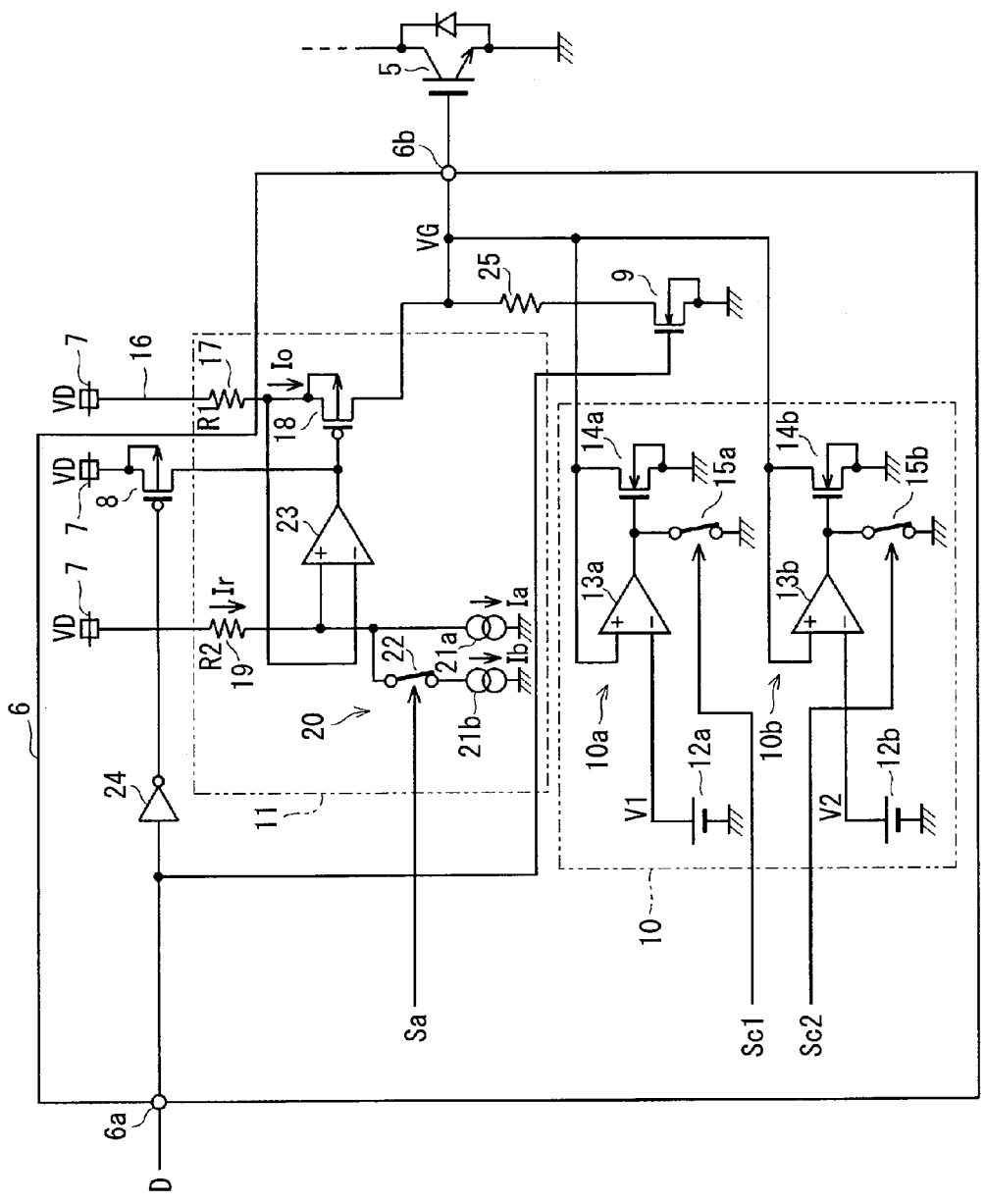
FIG. 1 is a diagram showing a gate driving circuit according to a first embodiment of the present disclosure.

The gate driving circuit 6 shown in FIG. 1 includes metal-oxide semiconductor (MOS) transistors 8, 9, which operate as gate control circuits, a gate voltage limit circuit 10, and a current limit circuit 11. A terminal 6a of the IC is an input terminal of the control signal D. A terminal 6b is an output terminal of a gate voltage VG. When the control signal D level-shifted through the photo coupler is equal to the power source voltage VD, that is, when the control signal D is at H level, the control signal is an off-command. When the control signal D is equal to a reference potential, that is, when the control signal D is at L level, the control signal is an on-command.

The gate voltage limit circuit 10 includes a gate voltage limit circuit 10a and a gate voltage limit circuit 10b. The gate voltage limit circuit 10a limits the gate voltage VG to be less than or equal to a first voltage V1. The gate voltage limit circuit 10b limits the gate voltage VG to be less than or equal to a second voltage V2. The gate voltage limit circuits 10a, 10b do not operate simultaneously. At turning-on driving of the IGBT, the gate voltage limit circuits 10a, 10b operate at timings concerted with each other.

The gate voltage limit circuit 10a includes a reference voltage generation circuit 12a, an operational amplifier 13a, a MOS transistor 14a, and a switch 15a. The reference voltage generation circuit 12a generates the first voltage V1. The operational amplifier 13a receives the first voltage V1 and the gate voltage VG. The MOS transistor 14a is coupled between the terminal 6b and the ground. The switch 15a is coupled between a gate of the MOS transistor 14a and the ground. Similarly, the gate voltage limit circuit 10b includes a reference voltage generation circuit 12b, an operational amplifier 13b, a MOS transistor 14b, and a switch 15b. The reference voltage generation circuit 12b generates the second voltage V2. The operational amplifier 13b receives the second voltage V2 and the gate voltage VG. The MOS transistor 14b is coupled between the terminal 6b and the ground. The switch 15b is coupled between a gate of the MOS transistor 14b and the ground.

The reference voltage generation circuits 12a, 12b are formed of a band gap circuit, which is provided in common, and an amplifier circuit or a resistance voltage dividing circuit that amplifies or divides a band gap voltage. The switches 15a, 15b are respectively turned on when clamp signals Sc1, Sc2 are at the L level, and the switches 15a, 15b are respectively turned off when clamp signals Sc1, Sc2 are at H level. Thus, when the clamp signals Sc1, Sc2 are at the L level, the operations of the gate voltage limit circuits 10a, 10b stop.

The current limit circuit 11 limits an electric current that flows to a gate voltage supply path 16 from the power source line 7 to the terminal 6b. In the gate voltage supply path 16, a resistor 17 and a p-channel type MOS transistor 18 are coupled in series. The resistor 17 is disposed outside of the IC so that a current limit value can be changed.

Between the power source line 7 and the ground, a resistor 19 and a current output circuit 20 are coupled in series. The current output circuit 20 includes two constant current circuits 21a, 21b coupled in parallel with each other and a switch 22 coupled in series with the constant current circuit 21b so that the current output circuit 20 can change the current value at two stages. The switch 22 is turned on when a current control signal Sa is at the H level, and the switch 22 is turned off when the current control signal Sa is at the L level. An operational amplifier 23 receive voltages of low-potential side terminals of the resistor 17 and the resistor 10 and transmits a voltage treated with differential amplification to a gate of the MOS transistor 18.

Between the power source line 7 and the gate of the MOS transistor 18, a p-channel type MOS transistor 8 is coupled. The gate of the MOS transistor 8 receives a signal which is obtained by inverting the control signal D by an inverter 24. Between the terminal 6b and the ground, a resistor 25 and an n-channel type MOS transistor 9 are coupled in series. A gate of the MOS transistor 9 receives the control signal D. The MOS transistors 8, 9 establish electrical continuity of the gate voltage supply path 16 from the power source line 7 to the gate terminal of the transistor 5 in response to the on-command and break electrical continuity of the gate supply path 16 in response to the off-command.

Next, effects of the present embodiment will be described with reference to FIG. 3. FIG. 3 is a diagram showing states of the control signal D, the clamp signals Sc1, Sc2, and the current control signal Sa and a waveform of the gate voltage VG. In the waveform of the gate voltage VG, a solid line indicates the gate voltage VG, a dashed-dotted line indicates a limit voltage of the gate voltage VG (the first voltage V1, the second voltage V2), and a dashed-two dotted line indicates a gate breakdown voltage VGES.

When the control signal D transitions from the H level (off-command) to the L level (on-command), the MOS transistors 8, 9 are turned off, gate capacitances are charged with a constant current, and the IGBT 5 is turned on. When the control signal D transitions from the L level to the H level, the MOS transistors 8, 9 are turned on, and the IGBT 5 is turned off. There is a mirror period at turning on.

When the gate driving circuit 6 activates (on-drives) the IGBT 5, the gate voltage limit circuit 10 limits the gate voltage VG in each of a first period (from time t1 to time t3) and a second period (after time t3). In the first period, the gate driving circuit 6 sets the clamp signal Sc1 to the H level and sets the clam signal Sc2 to the L level so as to operate the gate voltage limit circuit 10a. In the second period, the gate driving circuit 6 sets the clamp signal Sc1 to the L level. Furthermore, when the power source voltage VD is greater than the gate breakdown voltage VGES or when the power source voltage VD is not sufficiently less than the gate breakdown voltage VGES, the gate driving circuit 6 sets the clamp signal Sc2 as a gate protection signal to the H level so as to operate the gate voltage limit circuit 10b.

The first period just after the start of the on-driving is a period required for determining the presence or absence of a short circuit fault while limiting the current flowing to the IGBT 5 to be less than or equal to the maximum allowable current, in cases where a short circuit occurs in the IGBT 5 of the other arm (e.g., the IGBT 5up), which forms the bridge circuit with the present IGBT 5 (e.g., the IGBT 5un), the output nodes (x: u, v, w), windings of the brushless DC motor 4, and the like. The maximum allowable current is unique to the IGBT 5 and the maximum current that can be supplied to the IGBT without causing a failure.

The first voltage V1 generated by the reference voltage generation circuit 12a is determined so that when the first voltage V1 is used as the gate voltage VG of the IGBT 5, a collector current is limited to be less than or equal to the maximum allowable current regardless of a voltage between the collector and the emitter. It is needless to say that the first voltage V1 is less than the gate breakdown voltage VGES of the IGBT 5. When the gate voltage VG is greater than or equal to the first voltage V1, the gate voltage VG is clamped to the first voltage V1 due to a constant voltage effects of the operational amplifier 13a and the MOS transistor 14a (a period from time t2 to time t3).

Although it is not shown in the drawings, the gate driving circuit 6 includes a short-circuit fault determination circuit. The short-circuit fault determination circuit determines whether the collector current flowing to the IGBT 5 is greater than a fault criterion value in the first period. The fault criterion value is set to a value within a range greater than the maximum current that flows to the IGBT 5 when a short circuit does not occur and less than a current (less than or equal to the maximum allowable current) that flows to the IGBT 5 when a short circuit occurs. The first period is a fixed time longer than a time required for the short-circuit fault determination. If the short-circuit fault determination circuit determines that the collector current is greater than the fault criterion value, the short-circuit fault determination circuit turns on the MOS transistors 8, 9 when the first period ends to deactivate (off-drive) the IGBT 5.

The current limit circuit 11 limits the electric current lo flowing into the gate voltage supply path 16 at the on-driving, due to the constant current effects of the operational amplifier 23 and the MOS transistor 18. When electric currents flowing to the constant current circuits 21a, 21b, and the resistor 19 are Ia, Ib, Ir, and resistance values of the resistors 17, 19 are R1, R2, a limit value ILMT of the electric current lo can be expressed by the following equation (1).

$$ILMT = (R2/R1) \times Ir \qquad (1)$$

In the first period, until the gate voltage VG reaches the first voltage V1 (from time t1 to time t2), the current control signal Sa transitions to the H level and the switch 22 is turned on. Accordingly, Ir=Ia+Ib, the limit value ILMT increases, a charging speed of the gate capacitance increases, and the mirror period and the first period can be reduced. In a period after the gate voltage VG reaches the first voltage V1 (from time t2 to time t3), the current control signal Sa transitions to the L level and the switch 22 is turned off. Accordingly, Ir=Ia, and the limit value ILMT decreases. Thus, a driving current wasted away from the power source line 7 through the MOS transistors 18, 14a can be reduced.

The second period starts when the first period ends and it is determined that a short circuit does not occur. In the second period, in order to reduce loss, a sufficient gate voltage is required so that the IGBT 5 operates in a saturation region. However, when the gate voltage VG greater than the gate breakdown voltage VGES is applied to the IGBT 5, a failure occurs. Thus, when there is a possibility that the power source voltage VD exceeds the gate breakdown voltage VGES, the gate voltage limit circuit 10b is operated. In this case, the second voltage V2 generated by the reference voltage generation circuit 12b is less than or equal to the gate breakdown voltage VGES and is a sufficient voltage to operate the IGBT 5 in the saturation region (V1<V2≤GES). In order to secure a margin, the second voltage V2 may be slightly less than the gate breakdown voltage VGES.

When the gate voltage VG is greater than the second voltage V2, the gate voltage VG is clamped to the second voltage V2 due to the constant current effects of the operational amplifier 13b and the MOS transistor 14b (after time t4). A dashed line after time t4 in the gate voltage waveform in FIG. 3 indicates the gate voltage VG when the gate protection operation is not performed in a case where the power source voltage VD is greater than the gate breakdown voltage VGES.

In the second period, the current control signal Sa becomes the H level and the switch 22 is turned on until the gate voltage VG reaches the second voltage V2 (from time t3 to time t4). Accordingly, Ir=Ia+Ib and the limit value ILMT increases. Thus, a time required for the gate voltage VG to rise from the first voltage V1 to the second voltage V2 can be reduced. After the gate voltage VG reaches the second voltage V2, the current control signal Sa becomes the L level and the switch 22 is turned off. Accordingly, Ir=Ia, and the limit value ILMT decreases. Thus, a driving current wasted away from the power source line 7 through the MOS transistors 18, 14b can be reduced.

As described above, when the gate driving circuit 6 according to the present embodiment receives the on-command the gate driving circuit 6 limits the gate voltage VG to the first voltage V1 to operate the IGBT in an active region, and the gate driving circuit 6 performs the short-circuit fault determination while limiting the collector current to be less than or equal to the maximum allowable current. Accordingly, even when a short circuit fault occurs in a component in the inverter device 1, a secondary fault due to an excessive short-circuit current can be restricted. In other words, the gate driving circuit 6 according to the present embodiment can achieve a short circuit protection.

After the short-circuit fault determination, the gate driving circuit 6 changes the limit value of the gate voltage VG from the first voltage V1 to the second voltage V2, which is set to be less than the gate breakdown voltage VGES. Accordingly, even when the power source voltage VD exceeds the gate breakdown voltage VGES or even when a surge current is superimposed on the power source voltage VD, a gate failure and a reduction of a life of the IGBT 5 can be restricted. In other words, the gate driving circuit 6 can achieve a gate protection. Because the second voltage V2 is set to be the sufficient voltage to turn on the IGBT in the saturation region, a loss in an on-period can be reduced.

Because the first voltage V1 is naturally less than or equal to the gate breakdown voltage VGES, the gate driving circuit 6 does not need to perform the short circuit protection and the gate protection simultaneously. Focusing on this point, the gate voltage limit circuit 10 has a configuration for the gate protection operation as well as the short circuit protection operation. By this configuration, a size of a circuit can be reduced, reliability for failure can be improved, and a coordination operation between the protection operations can be easy.

In other words, by using the single gate voltage limit circuit 10, circuit delays with respect to changes of the clamp signals Sc1, Sc2 can be equalized and the short circuit protection and the gate protection can be continuously performed without interruption. Accordingly, the gate driving circuit 6 can protect the gate from an excessive voltage with certainty. Furthermore, when the voltages V1, V2 are generated based on a common band gap voltage and components in the operational amplifiers 13a, 13b and MOS transistors 14a, 14b are arranged symmetrically, a relative precision of the first voltage V1, which is the protection level used for the short circuit protection, and the second voltage V2, which is the protection level used for the gate protection, can be improved, and variation in elements and a difference between the voltages V1, V2 due to a change in temperature can be reduced.

In the first period and the second period, the gate driving circuit 6 sets the current limit values before the gate voltage VG is clamped to the first voltage V1 and the second voltage V2 to large values and sets the current limits values after clamp to small values. Accordingly, a turning-on time of the IGBT 5 can be reduced, and a power loss and a heat generation related to the gate driving of the IGBT 5 can be reduced.

(Second Embodiment)

Figure 4:
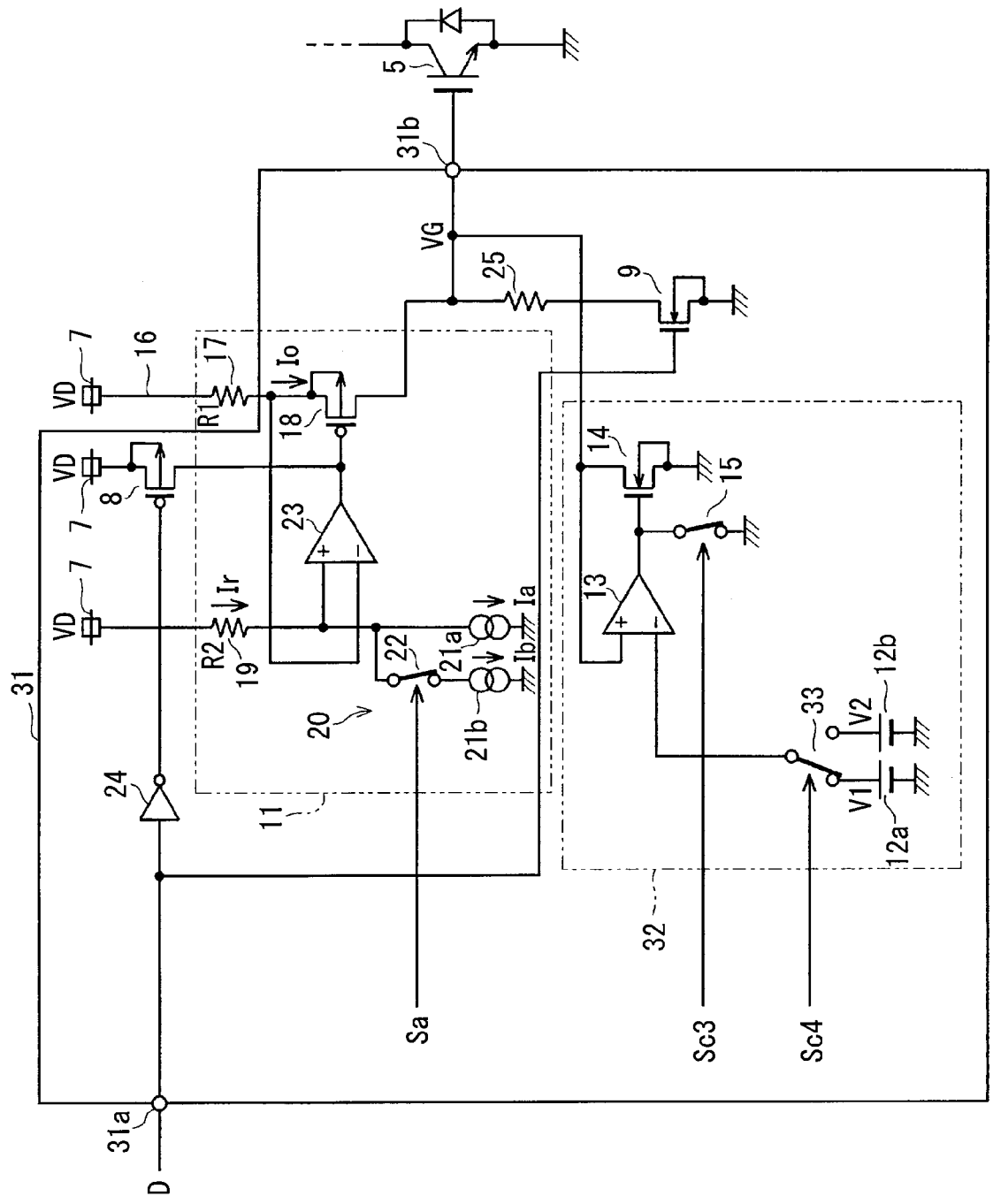
FIG. 4 is a diagram showing a gate driving circuit according to a second embodiment of the present disclosure.

A gate driving circuit 31 according to a second embodiment of the present disclosure will be described with reference to FIG. 4. A gate voltage limit circuit 32 in the gate driving circuit 31 has a configuration in which the gate voltage limit circuits 10a and 10b shown in FIG. 1 are commonalized except for the reference voltage generation circuits 12a, 12b. In other words, the gate voltage limit circuit 32 includes the reference voltage generation circuits 12a, 12b, the operational amplifier 13, the MOS transistor 14, and switches 15, 33. A clamp signals Sc3 controls an on-off state of the switch 15, and a clamp signal Sc4 controls a switching state of the switch 33.

In the first period, the gate driving circuit 31 selects the first voltage V1 by the clamp signal Sc4, and sets the clamp signal Sc3 to the H level to turn off the switch 15, thereby operating the gate voltage limit circuit 32. In the second period, when the power source voltage VD is greater than the gate breakdown voltage VGES or when the power source voltage VD is not sufficiently less than the gate breakdown voltage VGES, the gate driving circuit 31 selects the second voltage V2 by the clamp signal Sc4 and sets the clamp signal Sc3 to the H level, thereby operating the gate voltage limit circuit 32.

In the gate voltage limit circuit 32 according to the present embodiment, the gate voltage limit circuit relating to the short circuit protection and the gate voltage limit circuit relating to the gate protection are commonalized except for the reference potential generation circuits 12a, 12b. Thus, the size of the circuit can be further improved, the reliability for failure can be further improved, and the coordination operation between the protection operations can be much easier.

(Third Embodiment)

Figure 5:
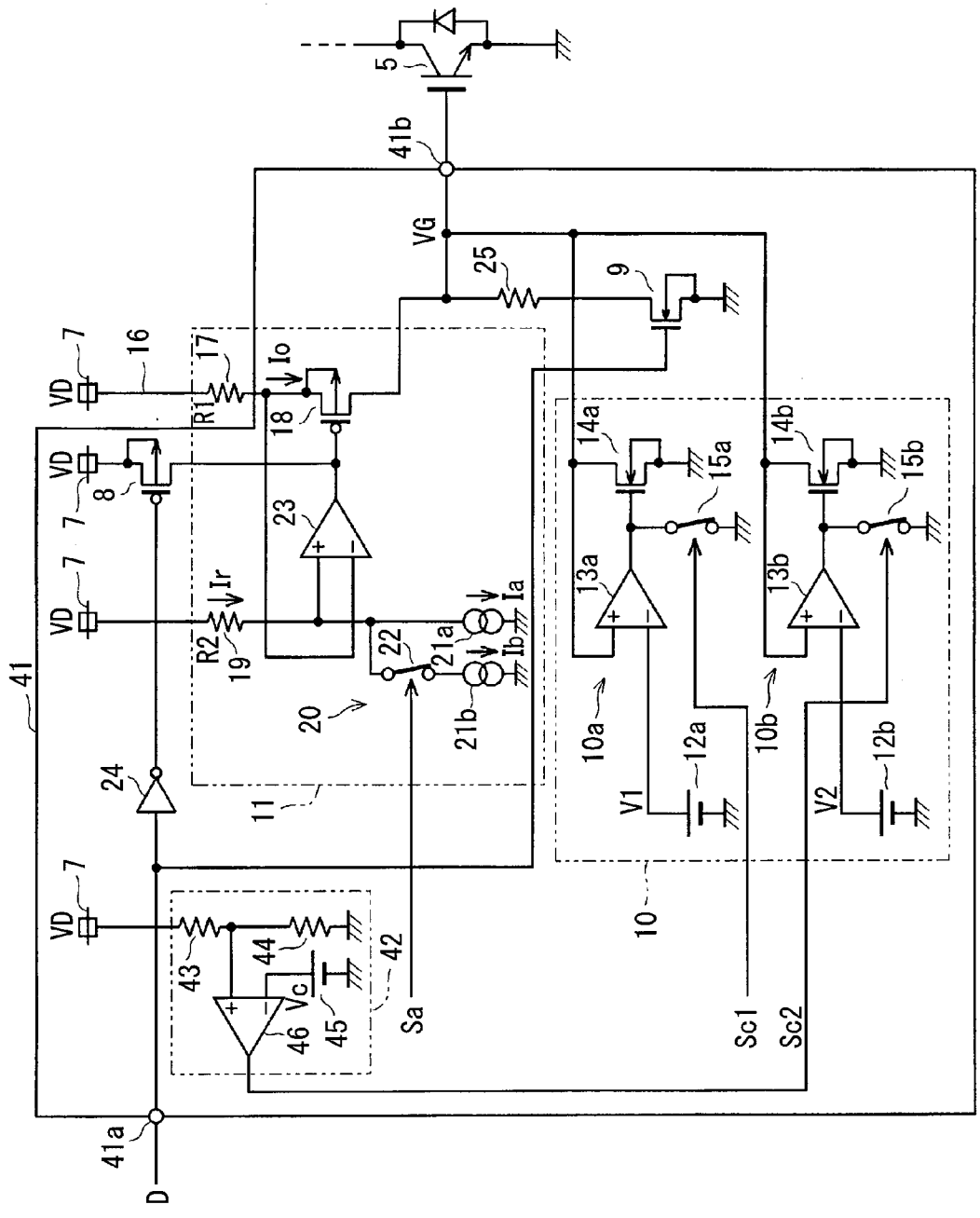
FIG. 5 is a diagram showing a gate driving circuit according to a third embodiment of the present disclosure.

A gate driving circuit 41 according to a third embodiment of the present disclosure will be described with reference to FIG. 5. The gate driving circuit 41 includes a power source voltage monitor circuit 42 that generates the clamp signal Sc2 (gate protection signal). The power source voltage monitor circuit 42 includes resistors 43, 44, a reference voltage generation circuit 45, and a comparator 46. The resistors 43, 44 divide the power source voltage VD at a predetermined division ratio. The reference voltage generation circuit 45 generates the reference voltage Vc. The comparator 46 compares the divided voltage and the reference voltage Vc. The reference voltage Vc is obtained by multiplying the predetermined division ratio to a monitor level that is set based on the gate breakdown voltage VGES of the IGBT 5.

The monitor level is set to be less than or equal to the second voltage V2. When the power source voltage VD is greater than or equal to the monitor level, the clamp signal Sc2 becomes the H level, and the gate voltage limit circuit 10b operates to limit the gate voltage VG to be less than or equal to the second voltage V2. In this case, when the power source voltage is greater than or equal to the monitor level, the switch 15b is turned off also in the first period. Thus, the gate voltage limit circuits 10a, 10b operates simultaneously. However, because a relationship of V1<V2 is satisfied, in the first period, the gate voltage limit circuit 10a operates to limit the gate voltage VG to be less than or equal to the first voltage V1 and the gate voltage limit circuit 10b does not operate. In the present embodiment, the gate driving circuit 41 starts and stops the gate protection operation. Thus, the clamp signal Sc2 from outside is unnecessary.

(Fourth Embodiment)

Figure 6:
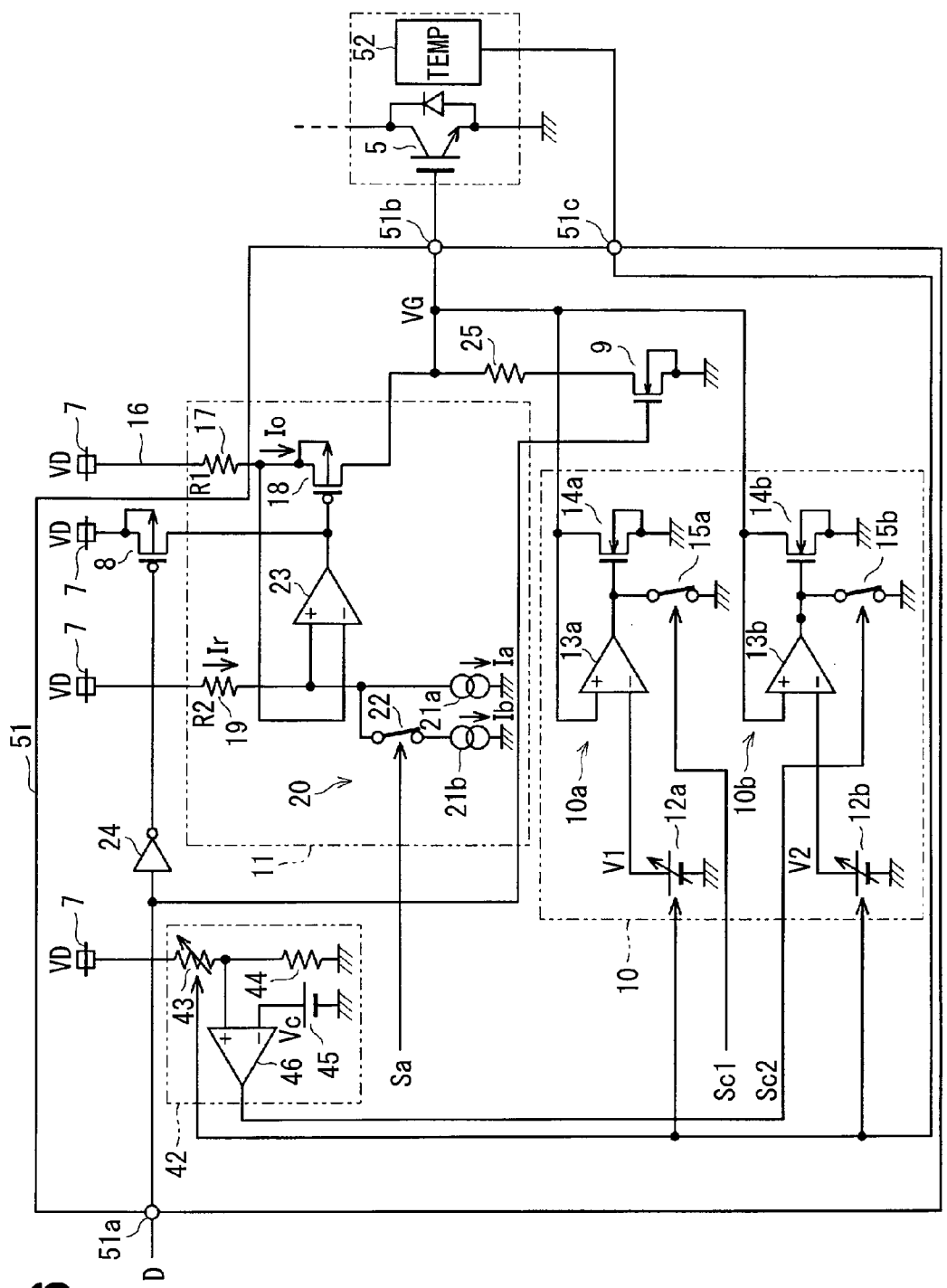
FIG. 6 is a diagram showing a gate driving circuit according to a fourth embodiment of the present disclosure.

A gate driving circuit 51 according to a fourth embodiment of the present disclosure will be described with reference to FIG. 6. The gate driving circuit 51 includes a temperature detection element 52 in a package of the IGBT 5. The temperature detection element 52 can operate as a temperature detection section and detects a temperature of the IGBT 5. The temperature detection element 52 is formed of, for example, a diode that is driven by a constant current and outputs a forward voltage as a temperature detection signal. The gate driving circuit 51 receives the temperature detection signal at a terminal 51c and changes the first voltage V1, the second voltage V2, and the resistance value of the resistor 43 (i.e., the monitor level) in accordance with the detection temperature. By this configuration, for example, the second voltage V2 can be controlled as follows.

(i) The second voltage V2 is increased with increase in the detection temperature. Static characteristics of the IGBT 5 deteriorate with increase in the detection temperature. In other words, the collector current decreases with increase in the detection temperature. Thus, by increasing the gate voltage VG with increase in the detection temperature, an on-state power loss can be reduced.

(ii) The second voltage V2 is decreased with increase in the detection temperature. A deterioration rate of a gate oxide layer of the IGBT 5 is increased with increase in the temperature and the voltage between the gate and the source.

Thus, by decreasing the gate voltage VG with increase in the detection temperature, the deterioration rate can be reduced.

(iii) The second voltage V2 is decreased with decrease in the detection temperature. The static characteristics of the IGBT 5 are improved with decrease in temperature. In other words, the collector current is increased with decrease in temperature. Thus, a surge current is likely to be generated at switching. Thus, by decreasing the gate voltage VG with decrease in the detection temperature, the surge current can be restricted.

In this way, the gate driving circuit 51 according to the present embodiment can appropriately protect the gate based on the temperature change of the static characteristics of the IGBT5 and the deterioration characteristic of the gate oxidation layer due to the temperature while reducing the loss generated in the IGBT 5 and reducing the deterioration of the gate oxide layer. In addition, when a short circuit fault occurs in the inverter device 1 or the brushless DC motor 4, the gate driving circuit 51 can control the electric current flowing to the IGBT 5 to be less than or equal to the maximum allowable current with certainty.

(Fifth Embodiment)

Figure 7:
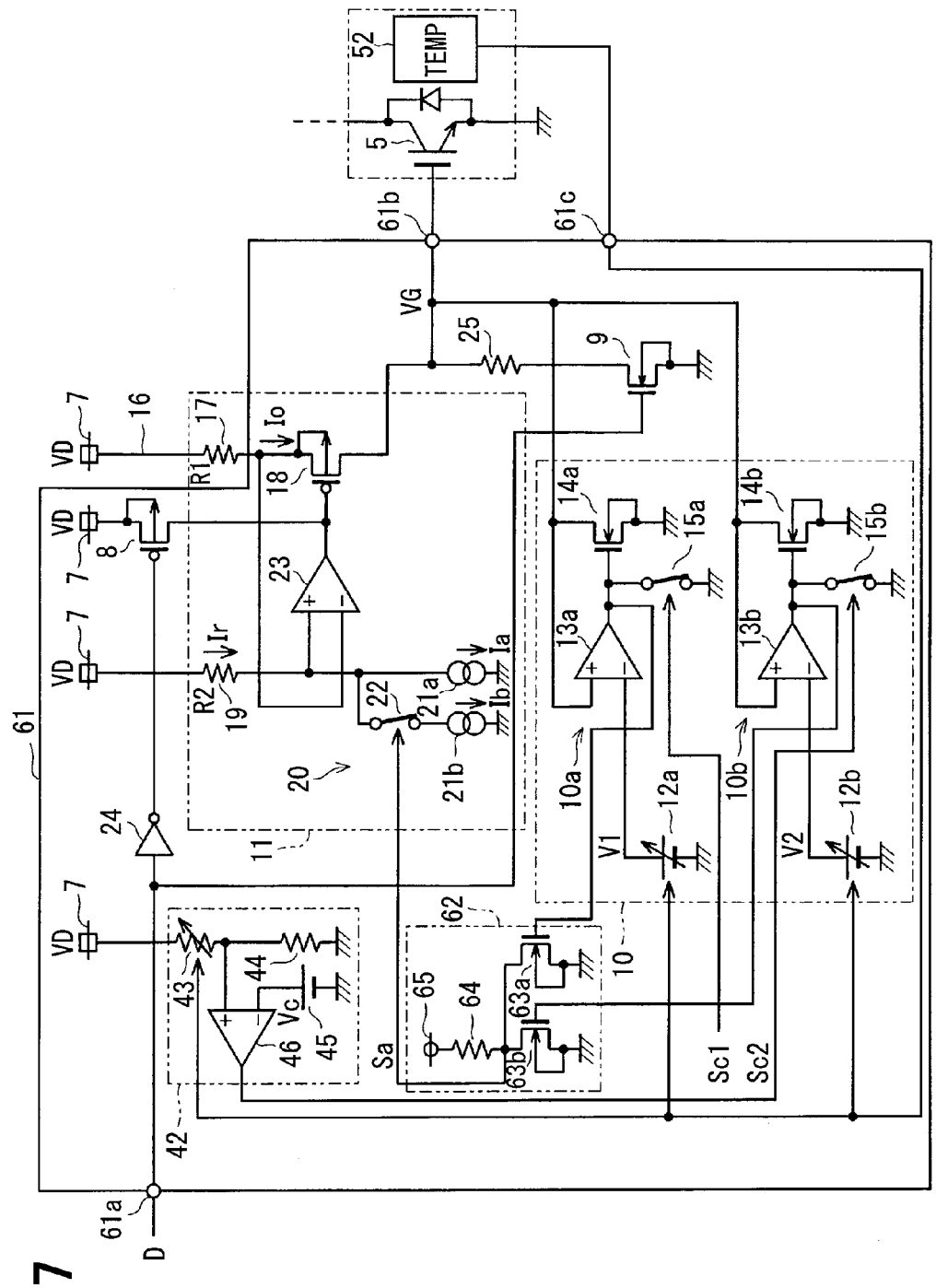
FIG. 7 is a diagram showing a gate driving circuit according to a fifth embodiment of the present disclosure.

A gate driving circuit 61 according to a fifth embodiment of the present disclosure will be described with reference to FIG. 7. The gate driving circuit 61 includes a clamp determination circuit 62. The clamp determination circuit 62 includes MOS transistors 63a, 63b and a resistor 64. The MOS transistors 63a, 63b are coupled in parallel with each other. The resistor 64 pulls up drains of the MOS transistors 63a, 63b to a control power source line 65 (e.g., 5V). Gates of the MOS transistors 63a, 63b are respectively coupled with the gates of the MOS transistors 14a, 14b.

When the gate voltage VG is clamped to the first voltage V1, the MOS transistor 14a and the MOS transistor 63a are turned on and the current control signal Sa becomes the L level. When the gate voltage VG is clamped to the second voltage V2, the current control signal Sa becomes the L level. In other words, the clamp determination circuit 62 detects a state where at least one of the gate voltage limit circuits 10a, 10b clamps the gate voltage VG. According to this configuration, the gate driving circuit 61 generates the current control signal Sa and appropriately controls the limit value ILMT of the electric current lo. Thus, a control signal from outside is unnecessary.

(Sixth Embodiment)

Figure 8:
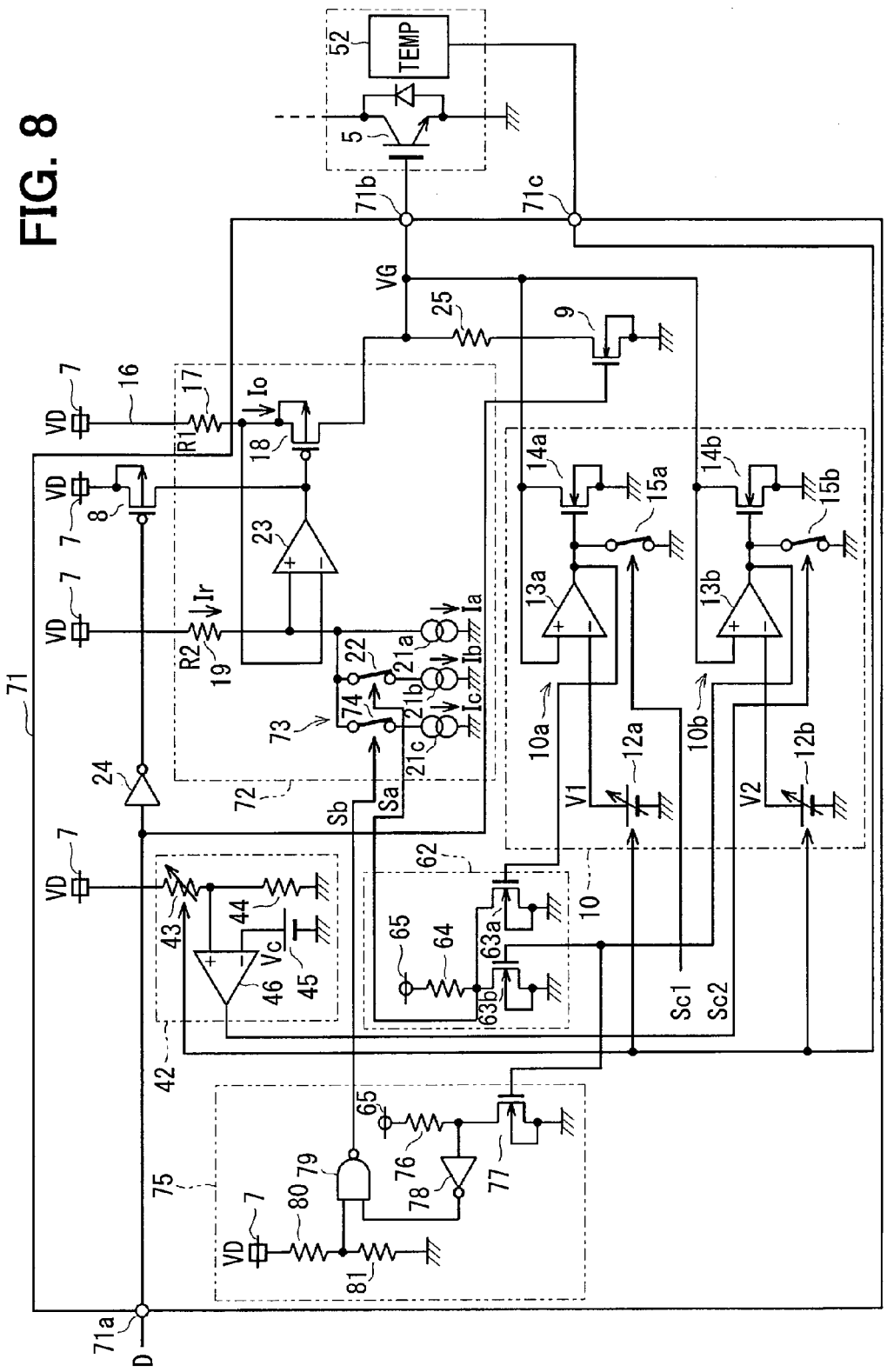
FIG. 8 is a diagram showing a gate driving circuit according to sixth embodiment of the present disclosure.

A gate driving circuit 71 according to a sixth embodiment of the present disclosure will be described with reference to FIG. 8. The gate driving circuit 71 includes a current limit circuit 72. The current limit circuit 72 includes a current output circuit 73 in which three constant current circuits 21a, 21b, 21c are coupled in parallel. The constant current circuit 21c is coupled in series with a switch 74. The switch 74 is turned on when a current control signal Sb is at the H level. The switch 74 is turned off when the current control signal Sb is at the L level. Electric current flowing into the constant current circuits 21a, 21b, 21c are Ia, Ib, Ic, respectively. The values Ia, Ib may be different from the values in the above-described embodiments. Thus, based on the current control signals Sa, Sb, the current limit circuit 72 can change the current in more stages than the current limit circuit 11b.

The gate driving circuit 71 includes a control voltage determination circuit 75 that generates the current control signal Sb. Between the control power source line 65 and the ground, a resistor 76 and a MOS transistor 77 are coupled in series. A drain voltage of the MOS transistor 77 is transmitted to a NAND gate 79 through the inverter 78. A gate of the MOS transistor 77 is coupled with the gate of the MOS transistor 14b. Between the power source line 7 and the ground, resistors 80, 81 are coupled in series, and a divided voltage is transmitted to the NAND gate 79. The current control signal Sb is an output signal of the NAND gate 79.

FIG. 9 is a diagram showing states of the control signal D, the clamp signals Sc1, Sc2, and the current control signals Sa,Sb and waveforms of the gate voltage VG and the current limit value ILMT. The operation in the first period and the operation without clamp in the second period are similar to the operations in the above-described embodiments. In this case, the limit value ILMT of the current Io is (R2/R1)×(Ia+Ib+Ic) or (R2/R1)×(Ia+Ic).

In the second period, when the gate voltage limit circuit 10b clamps the gate voltage VG to the second voltage V2, an output of an inverter 78 becomes the H level. In this state, when the power source voltage VD is less than a determination level that depends on a voltage division ratio of the resistors 80, 81 and a threshold value of the NAND gate 79, the current control signal Sb becomes the H level and the limit value ILMT becomes (R2/R1)×(Ia+Ic). On the other hand, when the power source voltage VD is greater than the determination level, the current control signal Sb becomes the L level, and the current value ILMT decreases to (R2/R1)×Ia.

The MOS transistor 18 in the current limit circuit 72 needs to bear a voltage difference between the power source voltage VD and the second voltage V2 at the clamp in the second period. Thus, the loss increases with increase in the power source voltage VD. The gate driving circuit 71 according to the present embodiment further decrease the limit value ILMT of the current Io when the power source voltage VD is greater than the determination level. Accordingly, increase in power consumption of the current limit circuit 72 and the gate driving circuit 71 can be restricted.

(Other Embodiments)

Although the present invention has been fully described in connection with the exemplary embodiments thereof with reference to the accompanying drawings, it is to be noted that various changes and modifications will become apparent to those skilled in the art.

Also in the third to sixth embodiments, the gate voltage limit circuit relating to the short circuit protection and the gate voltage limit circuit relating to the gate protection may be commonalized in a manner similar to the second embodiment. In this case, the MOS transistor 63b is unnecessary in the fifth and sixth embodiments, and the gate of the MOS transistor 63a is coupled with the gate of the MOS transistor 14. In the sixth embodiment, the gate of the MOS transistor 77 is coupled with the gate of the MOS transistor 14.

In the fourth to sixth embodiments, one or two of the first voltage V1, the second voltage V2 and the resistance value of resistor 43 (monitor level) may be changed in accordance with the detection temperature. Instead of the resistor 43, the resistance value of the resistor 44 or the reference voltage VB may be changed. In the sixth embodiment, the resistance value of the resistor 80 or the resistor 81 may be changed in accordance with the detection temperature. Also in the first and second embodiment, at least one of the first voltage and the second voltage may be changed in accordance with the detection temperature.

The current limit circuits 11, 72 may be configured to limit the electric current flowing into the gate voltage supply path 16 in at least a part of a period in which the gate voltage of the IGBT 5 is limited to be equal to the second voltage V2 in the second period.

The current limit circuits 11, 72 may be configured not to limit the electric current flowing into the gate voltage supply path 16 before the gate voltage VG is clamped to the first voltage V1 and the second voltage V2 in the first period and the second period. Accordingly, the turning-on time of the IGBT 5 can be further reduced.

In the first to third embodiments, the clamp determination circuit 62 may be included. In the first to fourth embodiments, the current limit circuit 11 may be replaced by the current limit circuit 72 and the control voltage determination circuit 75 may be included.

The current limit circuit 72 and the control voltage determination circuit 75 may limit in multiple stages in such a manner that the electric current flowing into the gate voltage supply path 16 is reduced with increase in the power source voltage VD. The current limit circuit 11 may be configured to change the current value in more stages. Instead of the IGBT 5, a voltage driving semiconductor element such as a MOS transistor may be used.

What is claimed is:

1. A gate driving circuit comprising:
a gate control circuit establishing electrical continuity of a gate voltage supply path from a power source line to a gate terminal of a transistor in response to an on-command and breaking electrical continuity of the gate supply path in response to an off-command, and
a gate voltage limit circuit limiting a gate voltage of the transistor to be less than or equal to a first voltage in response to the on-command at least in a period until a determination of whether an electric current greater than a fault criterion value flows to the transistor ends and then limiting the gate voltage of the transistor to be less than or equal to a second voltage,
wherein the first voltage is set so that the electric current flowing to the transistor is less than or equal to a maximum allowable current regardless of a voltage applied to the transistor, and
wherein the second voltage is set to be less than or equal to a gate breakdown voltage of the transistor, and
a power source voltage monitor circuit transmitting a gate protection signal when a voltage of the power source line is greater than or equal to a monitor level that is set in accordance with the gate breakdown voltage of the transistor,
wherein after the period in which the gate voltage limit circuit limits the gate voltage of the transistor to be less than or equal to the first voltage ends, the gate voltage limit circuit limits the gate voltage to be less than or equal to the second voltage when the gate protection signal is transmitted, and the gate voltage limit circuit does not limit the gate voltage when the gate protection signal is not transmitted.

2. The gate driving circuit according to claim 1, further comprising
   a temperature detection section detecting a temperature of the transistor,
   wherein the power source voltage monitor circuit is configured to change the monitor level in accordance with the temperature detected by the temperature detection section.

3. A gate driving circuit comprising:
   a gate control circuit establishing electrical continuity of a gate voltage supply path from a power source line to a gate terminal of a transistor in response to an on-command and breaking electrical continuity of the gate supply path in response to an off-command, and
   a gate voltage limit circuit limiting a gate voltage of the transistor to be less than or equal to a first voltage in response to the on-command at least in a period until a determination of whether an electric current greater than a fault criterion value flows to the transistor ends and then limiting the gate voltage of the transistor to be less than or equal to a second voltage,
   wherein the first voltage is set so that the electric current flowing to the transistor is less than or equal to a maximum allowable current regardless of a voltage applied to the transistor, and
   wherein the second voltage is set to be less than or equal to a gate breakdown voltage of the transistor, and
   a temperature detection section detecting a temperature of the transistor,
   wherein the gate voltage limit circuit is configured to change a level of at least one of the first voltage and the second voltage in accordance with the temperature detected by the temperature detection section.

4. A gate driving circuit comprising:
   a gate control circuit establishing electrical continuity of a gate voltage supply path from a power source line to a gate terminal of a transistor in response to an on-command and breaking electrical continuity of the gate supply path in response to an off-command, and
   a gate voltage limit circuit limiting a gate voltage of the transistor to be less than or equal to a first voltage in response to the on-command at least in a period until a determination of whether an electric current greater than a fault criterion value flows to the transistor ends and then limiting the gate voltage of the transistor to be less than or equal to a second voltage,
   wherein the first voltage is set so that the electric current flowing to the transistor is less than or equal to a maximum allowable current regardless of a voltage applied to the transistor, and
   wherein the second voltage is set to be less than or equal to a gate breakdown voltage of the transistor, and
   a current limit circuit limiting an electric current flowing to the gate voltage supply path to be less than or equal to a current limit value in at least a part of a period in which the gate voltage limit circuit limits the gate voltage of the transistor to be equal to the second voltage.

5. The gate driving circuit according to claim 4,
   wherein the current limit circuit limits the electric current flowing to the gate voltage supply path in such a manner that the electric current is reduced with increase in the voltage of the power source line.

6. The gate driving circuit according to claim 4,
   wherein the current limit circuit limits the electric current flowing to the gate voltage supply path in a period from when a limit value of the gate voltage of the transistor is changed from the first voltage to the second voltage to when the gate voltage reaches the second voltage to be a current limit value that is greater than the current limit value in the period when the gate voltage is limited to be equal to the second voltage.

7. The gate driving circuit according to claim 4,
   wherein the current limit circuit does not limit the electric current flowing to the gate voltage supply path in a period from when a limit value of the gate voltage of the transistor is changed from the first voltage to the second voltage to when the gate voltage reaches the second voltage.

* * * * *